(12) United States Patent
Jang et al.

(10) Patent No.: US 6,420,241 B2
(45) Date of Patent: *Jul. 16, 2002

(54) METHOD FOR FORMING AN ISOLATION REGION IN A SEMICONDUCTOR DEVICE AND RESULTING STRUCTURE USING A TWO STEP OXIDATION PROCESS

(75) Inventors: Se Aug Jang; Young Bog Kim; In Seok Yeo; Jong Choul Kim, all of Ichon (KR)

(73) Assignee: Hyundai Electronics Industries Co., Ltd., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,291

(22) Filed: Apr. 17, 1998

(30) Foreign Application Priority Data

Jun. 2, 1997 (KR) .............................. 97-22708

(51) Int. Cl.[7] .............................................. H01L 21/76
(52) U.S. Cl. ........................ 438/443; 438/445; 438/452
(58) Field of Search ................................. 438/452, 298, 438/443, 445

(56) References Cited

U.S. PATENT DOCUMENTS

| 4,551,910 A | * | 11/1985 | Patterson |
|---|---|---|---|
| 4,708,768 A | * | 11/1987 | Enomoto et al. |
| 4,784,975 A | * | 11/1988 | Hofmann et al. |
| 4,987,093 A | * | 1/1991 | Teng et al. |
| 5,139,964 A | | 8/1992 | Onishi et al. ................ 437/70 |
| 5,139,965 | | 8/1992 | Lee 437/72 |
| 5,151,381 A | * | 9/1992 | Liu et al. |
| 5,173,444 A | | 12/1992 | Kawamura .................. 437/69 |
| 5,285,102 A | * | 2/1994 | Ying |
| 5,374,586 A | * | 12/1994 | Huang et al. ................ 437/67 |
| 5,399,520 A | | 3/1995 | Jang ............................ 437/67 |
| 5,554,560 A | | 9/1996 | Hsuet et al. ................. 437/69 |
| 5,637,528 A | * | 6/1997 | Higashitani et al. |
| 5,719,086 A | * | 2/1998 | Kim et al. |

FOREIGN PATENT DOCUMENTS

| GB | 2 320 803 A | 1/1998 | ......... H01L/21/762 |
|---|---|---|---|
| JP | 7297180 A | 11/1995 | |

OTHER PUBLICATIONS

Ghandhi, Sorab K., VLSI Fabrication Principles, pp. 385–388, 1983.*

Wolf, Stanley, Silicon Processing for the VLSI Era, vol. 2, pp. 28–31, 1990.*

* cited by examiner

*Primary Examiner*—Carl Whitehead, Jr.
*Assistant Examiner*—Ron Pompey
(74) *Attorney, Agent, or Firm*—Townsend and Townsend and Crew, LLP

(57) ABSTRACT

A method for forming an element isolation film of a semiconductor device and the semiconductor device. A pad insulator is constructed on a semiconductor substrate. An over-etching process is performed to recess the semiconductor substrate to a predetermined depth while giving a pad insulator pattern. After an insulator spacer is formed at the side wall of the pad insulator pattern, the exposed region of the semiconductor substrate is thermally oxidized to grow an oxide which is, then, removed to form a recess. An element isolation film is formed in the recess by break-through field oxidation and high temperature field oxidation. The element isolation film thus obtained can prevent the field oxide "ungrowth" phenomenon and at the same time mitigate the field oxide thinning effect as well as improve the properties of the gate oxide.

19 Claims, 15 Drawing Sheets

METHOD FOR FORMING AN ISOLATION REGION IN A SEMICONDUCTOR DEVICE AND RESULTING STRUCTURE USING A TWO STEP OXIDATION PROCESS

BACKGROUND OF THE INVENTION

The present invention relates to semiconductor integrated circuits. More particularly, the present invention provides a technique, including a method and structure, for forming an isolation region or film in a semiconductor device. In an embodiment, the present invention provides a novel isolation technique by which semiconductor devices can be highly integrated for sub-micron sized devices.

In order to increase the degree of integration of semiconductor devices, it is desirable to reduce dimensions of active device elements, and also reduce dimensions of width and area of isolation regions, which are formed between the active device elements. Because the amount of reduction roughly determines, for example, a memory cell size, the isolation technique employed plays an important role in highly integrated memory cells.

Industry has used or proposed a variety of techniques to form isolation regions for a semiconductor device. As merely an example, conventional methods of forming isolating films include, among others, a local oxidation of silicon, which is commonly termed the LOCOS process, by which a field oxide is thermally grown in exposed regions, and a mask made of silicon nitride covers regions for active devices. The LOCOS process, however, often has significant problems such as a commonly known problem called "bird's beak" which reduces the size of active regions. The bird's beak often makes high integration of semiconductor devices difficult. In addition, LOCOS is often not a "good" isolation between active devices since the available volume of field oxide under, for example, the silicon surface is no more than 40–45% of its total volume.

In order to solve some of the aforementioned limitations, an alternative technique has been used, which is commonly termed trench isolation. Trench isolation is formed by etching grooves or slits in a semiconductor material by way of etching techniques, e.g., reactive ion etching and others. The grooves or slits are filled with a dielectric material or isolating material such as silicon dioxide or the like to isolate active regions in the semiconductor substrate. The trench process has been introduced by virtue of its advantages in that the field oxide is fully available and has no bird's beak. The trench process, however, is very complicated. There has also been developed a modified LOCOS process in which the bird's beak is shortened by forming a nitride spacer at the side wall of an element isolating region and a field oxide is grown in a shallow recess formed in a semiconductor substrate. The modified LOCOS process, however, also has severe limitations.

From the above, it is seen that a technique for improving isolation in semiconductor integrated circuits is highly desirable.

SUMMARY OF THE INVENTION

According to the present invention, a technique, including a method and structure, for isolating a device region is provided. In an exemplary embodiment, the present invention provides an isolation technique with selective temperature control to avoid problems of conventional techniques.

In accordance with an aspect of the present invention, a method for forming an element isolation film or region in a semiconductor device is provided. The method includes, among others, a step of providing a semiconductor substrate. The method also includes a step of constructing an element isolation mask on a surface of the semiconductor substrate. A spacer at a side wall of the element isolation mask is formed. The entire substrate, including isolation mask and side wall, is oxidized where an exposed region of the semiconductor substrate grows an oxide, e.g., silicon dioxide, thermal oxide. The method includes a step of removing the oxide to form a recessed region in the semiconductor substrate. A field oxide is formed through breakthrough field oxidation (hereinafter referred to as "BTFOX") and high temperature field oxidation (hereinafter referred to as "HTFOX"). BTFOX and HTFOX will be described in more detail below.

Numerous advantages are achieved by way of the present invention over pre-existing techniques. As merely an example, the present invention provides a semiconductor device with a field oxide that is formed in a recess in a field region of a semiconductor substrate by a combination of BTFOX and HTFOX, which are relatively easy to implement. Additionally, the present invention overcomes one or more of the limitations encountered in conventional LOCOS using, for example, a novel method for forming an element isolation film or isolation region of a semiconductor device, which can take advantage of high temperature field oxidation without creating a field oxide ungrowth (herein "FOU") phenomenon. Furthermore, the present invention provides a semiconductor device having an FOU-free element isolation film formed through high temperature field oxidation. These and other benefits are advantages are described throughout the present specification and more particularly below.

The present invention achieves these benefits in the context of known process and product technology. The above benefits and/or aspects of the invention will become apparent from the following description of embodiments with reference to the accompanying drawings.

DETAILED DESCRIPTION OF THE SPECIFIC EMBODIMENTS

Conventional LOCOS Process

Figure 1A:
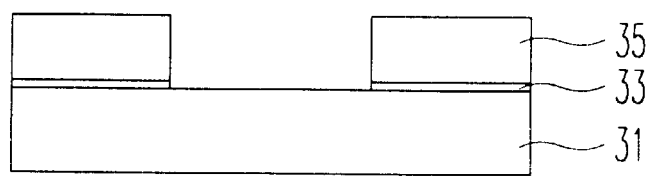
FIGS. 1a through 1e are simplified schematic cross sectional views showing a conventional method for forming an isolation film of a semiconductor device.
Figure 1B:
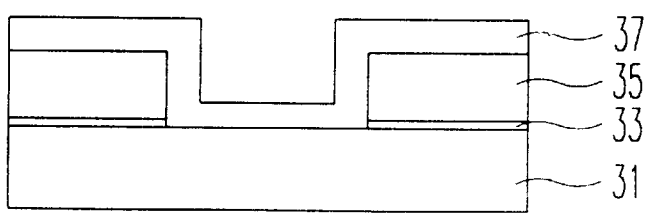
Figure 1C:
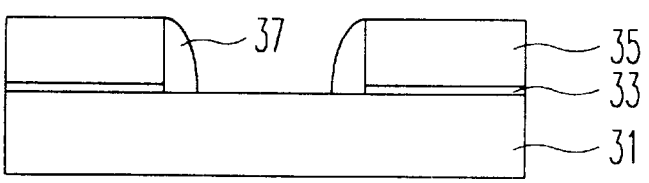

In order to better understand the present invention, a brief description will be given of conventional techniques in conjunction with some simplified figures such as the ones described below. Referring to FIG. 1, a conventional method of forming an element isolation film in a semiconductor device using LOCOS is illustrated. The method begins with a semiconductor substrate 31 which has an overlying pad oxide 33 and an overlying pad nitride 35 that are sequentially formed, as shown in FIG. 1a, for example. After a patterning step, a nitride 37 is deposited entirely over the resulting structure and then, anisotropically etched by way of plasma etching. Plasma etching forms a nitride spacer, as shown in FIGS. 1b and 1c.

Figure 1D:
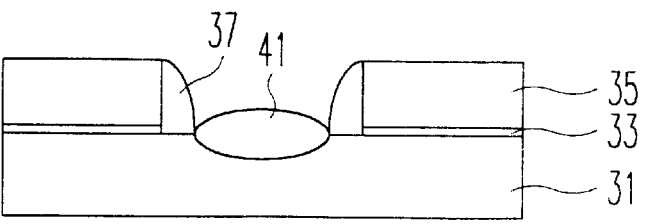
Figure 1E:
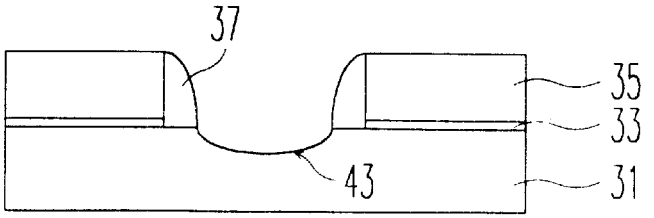

Subsequently, the exposed region of the semiconductor substrate 31 is thermally oxidized to grow an oxide 41 or field oxide, as shown in FIG. 1d. The field oxide 41 is removed to create a recess 43, as shown in FIG. 1e. Thereafter, the recess 43 in the semiconductor substrate 31 is oxidized to form a field isolation oxide (not shown). This conventional LOCOS process is advantageous in that the oxidation allows the recess 43 to be formed at an accurate depth in the semiconductor substrate.

However, it also has some disadvantages. In order to restrain the bird's beak problem, the nitride spacer generally must have a thickness of 500 Angstrom or more. The thick nitride spacer can prevent the expansion of bird's beak, but often cannot be applied for very large scaled integration because the element isolation region can have narrower widths as the integration degree of devices increases. For instance, where a design rule of a device is 0.20 μm, if the nitride spacer is 500 Angstrom thick, the width of the element isolation region exposed is reduced by 0.10 μm because the nitride spacer is present at the opposite side walls. Thus, there occurs a field oxide thinning effect with which the field oxide thinly grows in a narrow field region compared to that in a wide field region.

Additionally, in order to mitigate the field oxide thinning effect even to a small isolation spacing, the field oxidation temperature must generally be high. The high field oxidation temperature, however, causes a field-oxide-ungrowth (hereinafter referred to as "FOU") phenomenon in the process of FIG. 1, as well.

The FOU phenomenon is reported by B. J. Cho, et al. ("Cho"), in "Anomalous Field-Oxide-Ungrowth Phenomenon in Recessed Local Oxidation of Silicon Isolation Structure", Journal of Electrochemical Society, Vol. 144, No. 1, pp 320–326 (1997), which is incorporated by reference for all purposes. Since the FOU phenomenon gives rise to a fatal failure such as an electrical short in the operating device, it should be clearly removed.

FIG. 2 illustrates the FOU phenomenon in detail, in connection with FIG. 1. First, a pad oxide 53 and a pad nitride 55 are sequentially formed at their own respective thicknesses over a semiconductor substrate 51, as shown in FIG. 2a. The pad nitride 55 and the pad oxide 53 are opened or etched at an element isolation region to form a pattern. Then, a nitride spacer 57 is formed at the side wall of the pattern. At this time, a nitrogen-containing polymer 59 is formed on the element isolation region of the semiconductor device 51 exposed.

Figure 2A:
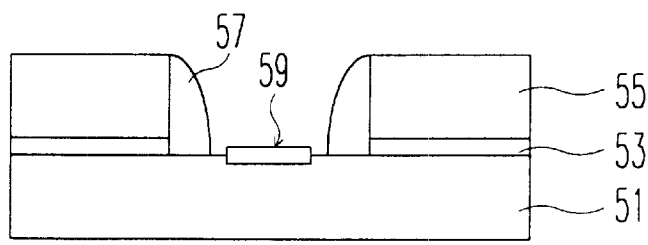
FIGS. 2a through 2d are simplified schematic cross sectional views showing an FOU phenomenon caused by a conventional method.
Figure 2B:
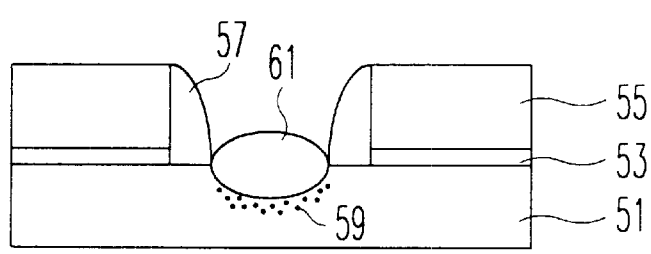

Whereas the formation of the nitrogen-containing polymer occurs in the place where the area ratio of active region to field region is small, a large amount of the nitrogen-containing polymer is formed in peripheral circuits in which the area of active region is relatively great as compared with that of field region. The nitrogen-containing polymer which is formed during the etching step for the nitride spacer 57, is released outside or redeposited on gully-shaped field regions but, because the polymer is formed at a large amount in peripheral circuit regions, a part of the polymer remains on the bottom of the field region. The nitrogen-containing polymer 59 is by no means removed by conventional wet washing as it chemically binds to the semiconductor substrate 51. Thereafter, an oxidation process is carried out at a temperature of 1,000° C. or lower, to grow an oxide 61, as shown in FIG. 2b. At this time, the nitrogen in the nitrogen-containing polymer 59 is not present on the oxide 61 but below the oxide 61, that is, redistributed in the interface between the oxide film 61 and the semiconductor substrate 51.

Figure 2C:
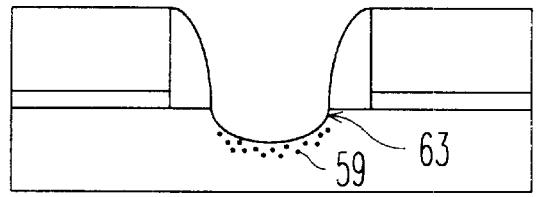
Figure 2D:
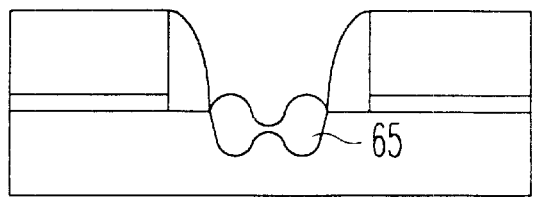
Figure 3A:
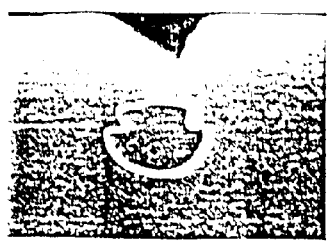
FIGS. 3 through 5 illustrate a simplified method for forming an isolation film of a semiconductor device according to an embodiment of the present invention.
Figure 3B:
Figure 3C:
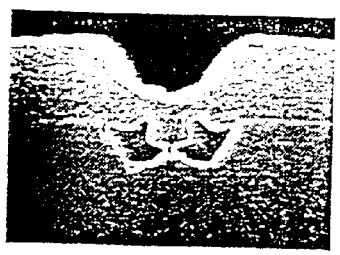
Figure 3D:

The oxide 61 is wet-etched to form a recess 63, as shown in FIG. 2c. The nitrogen is not removed, but still remains in the interface between the oxide 61 and the semiconductor substrate 51. Subsequently, the exposed region of the semiconductor substrate, that is, the recess 63, is subjected to field oxidation, to form a field oxide 65. If the field oxidation is carried out above a temperature of 1,050° C., the FOU phenomenon occurs, as shown in FIG. 2d.

The element isolation processes based on LOCOS yield a serious field oxide thinning effect, a phenomenon in which a field oxide is more thinly grown in a narrow field region than in a wide field region, as reported in the article of J. W. Lutze, "Field oxide thinning in poly buffer LOCOS isolation with active area spacing to 0.1 μm", Journal of Electrochemical Society, Vol. 137, No. 6, pp. 1867–1870 (1990).

As described above, the conventional techniques cannot avoid at least these two problems, including the field oxide thinning effect and the FOU phenomenon. For example, the high temperature field oxidation process which was used to overcome the field thinning effect causes the FOU phenomenon such that the semiconductor devices are poor in characteristics and reliability and difficult to highly integrate.

Embodiments of the Present Invnetion

The application of specific embodiments of the present invention can best be understood with reference to the accompanying drawings. These drawings are merely illustrative, and should not limit the scope of the claims herein. One of ordinary skill in the art would recognize other variations, alternatives, and modifications. Additionally, the drawings below use like reference numerals as some of the previous drawings for like and/or corresponding parts or elements.

Figure 4:
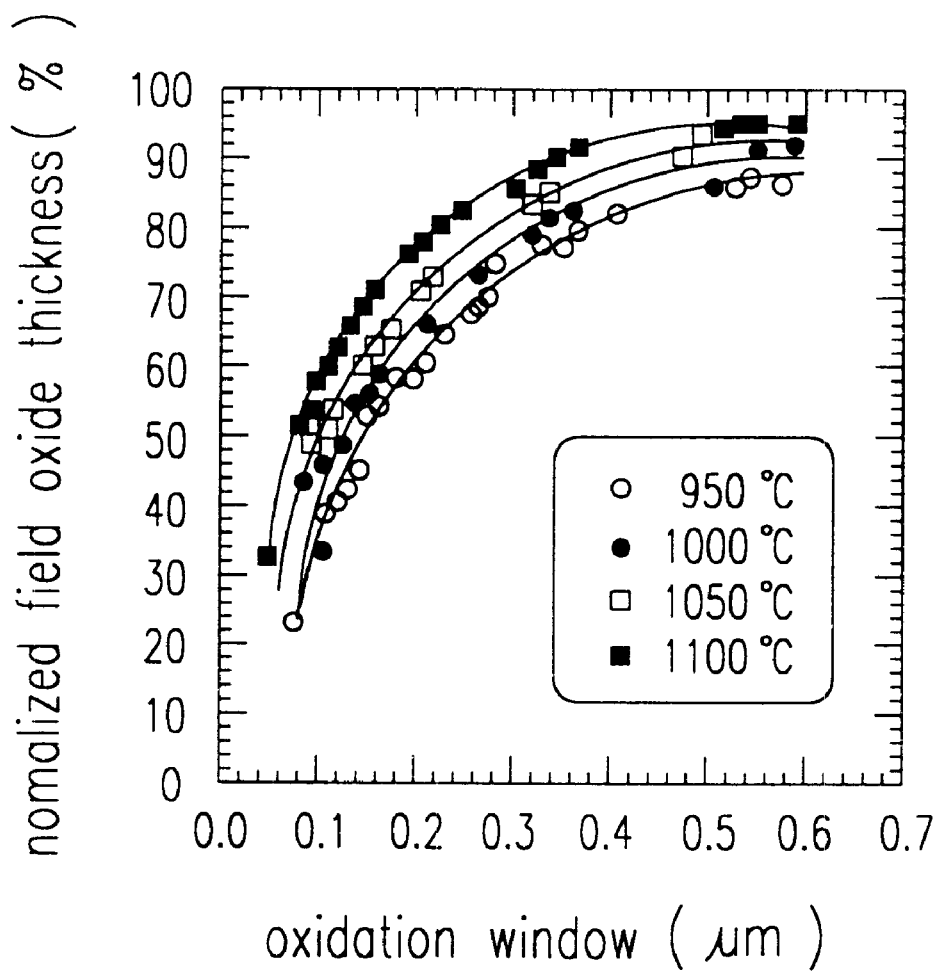
Figure 5:
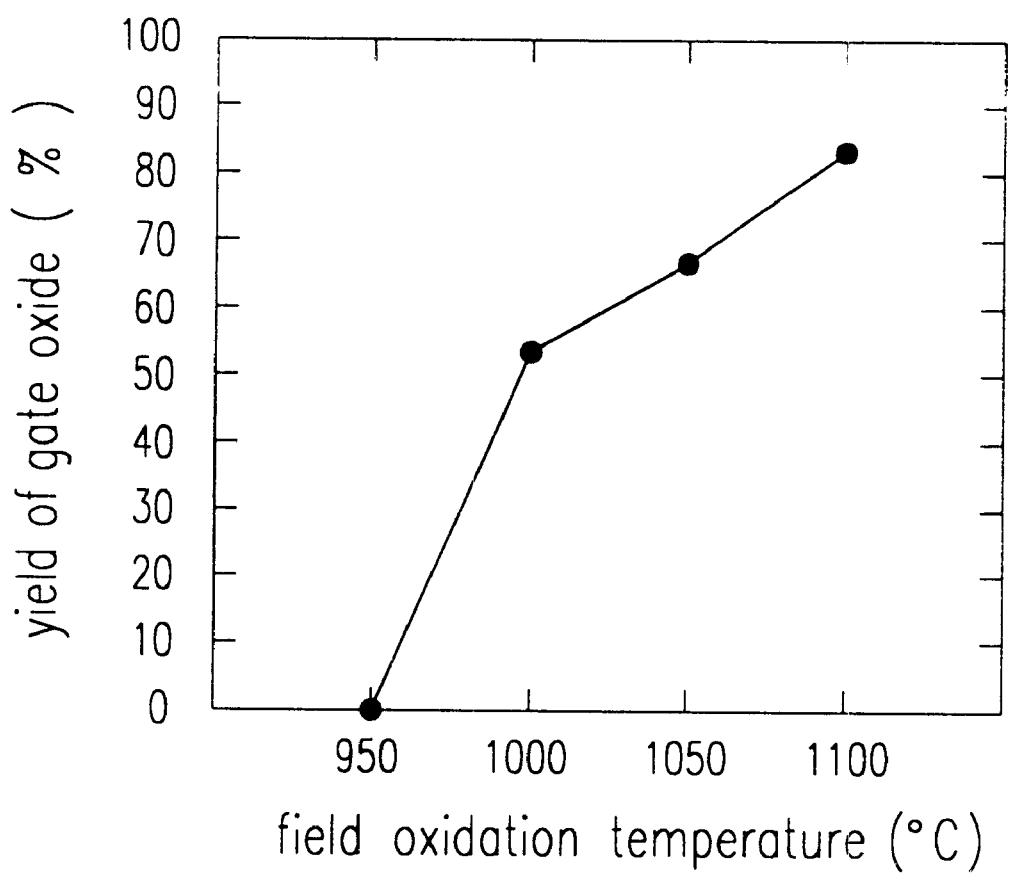

FIGS. 3 to 5 illustrate a simplified method for forming an element isolation film of a semiconductor device according to an embodiment of the present invention. Referring to FIGS. 3a to 3d, for example, various cross sections of devices showing changes in shapes of field oxides at different temperatures are illustrated. processes depicted by FIG. 1e or 2c, but at different temperatures, as well as other factors. FIG. 3a shows a field oxide formed at 950° C. in a wet oxidation manner. FIG. 3b shows a field oxide formed at 1,000° C. FIG. 3c shows a field oxide formed at 1,050° C. FIG. 3d shows a field oxide formed at 1,100° C. As shown in the Figs., a field oxidation temperature as high as or higher than 1,050° C. causes an FOU phenomenon but at a temperature lower than 1,050° C., this phenomenon does not appear to occur.

As merely an example, data obtained from experiments in which the field oxidation was carried out at a temperature interval of 10° C. in a range of 1,000–1,050° C., show that substantially no FOU phenomenon is observed at a temperature lower than 1,040° C. Accordingly, it is suggested that a transition temperature at which an oxidation barrier is produced is in the range of 1,040–1,050° C. and that, when the field oxidation is executed at a temperature exceeding the transition temperature, the FOU phenomenon occurs.

Although the nitrogen-containing polymer remains on the recess 63, the field oxide 65 is normally grown when the field oxidation is performed at a temperature lower than 1,040° C. In other words, the nitrogen-containing polymer cannot play a role as an oxidation barrier by itself and must be converted into the oxidation barrier through thermal activation at a certain temperature or higher. That is, a range of 1,040–1,050° C. is a transition temperature at which the oxidation barrier, a factor causing the FOU phenomenon, is produced. Thus, in order to solve the FOU phenomenon of the conventional techniques, the field oxidation temperature should be lower than 1,040° C. (see FIGS. 2d and 3) in these embodiments.

FIG. 4 is a simplified graph in which the thicknesses of the field oxides are compared according to field oxidation temperatures. The data obtained from the graph show that, when a field oxidation is carried out at a high temperature, the field oxide thinning effect is reduced so that a thick field oxide can be produced. If serious field oxide thinning effect occurs, parasitic transistor threshold voltages and punch-through voltages are disadvantageously lowered. In addition, because a field oxide is in direct contact with a gate oxide in a semiconductor device, the stress of the semiconductor substrate which is generated by the element isolation, may exert a fatal influence upon the reliability of the gate oxide which is formed later.

Generally, because a field oxide is of high viscosity when it is formed at a low temperature, the stress caused owing to the volume expansion of the field oxide during field oxidation is not relieved, but is transferred into the semiconductor substrate. As a result, the reliability of the gate oxide is more deteriorated as the field oxidation is carried out at lower temperatures, as shown in FIG. 5.

In FIG. 5, the yield of gate oxide is plotted with respect to the temperature of field oxidation. As shown in this plot, it is advantageous for the yield of gate oxide as well as for the field oxide thinning effect that the field oxidation is carried out at higher temperatures. However, the high temperature field oxidation causes an FOU phenomenon, as aforementioned.

FIGS. 6 to 17 illustrate a simplified method for forming an element isolation film of a semiconductor device according to an embodiment of the present invention. These Figs. are merely illustrations and should not limit the scope of the claims herein. Referring to FIG. 6, stepwise processes of forming an element isolation film of a semiconductor device are shown. First, as shown in FIG. 6a, a semiconductor substrate 11 is provided. A pad oxide 13 and a pad nitride 15 are, in sequence, deposited, over the substrate followed by etching the pad nitride 15 and the pad oxide 13 with an element isolation mask (not shown) to form a pattern. An over-etch process is performed to recess the semiconductor at a depth of 50–100 Angstrom, for example. Then, a nitride 17 ranging, in thickness, from 50 to 300 Angstrom, but is not limited to this range, is deposited over the resulting structure as shown in FIG. 6b.

Figure 6A:
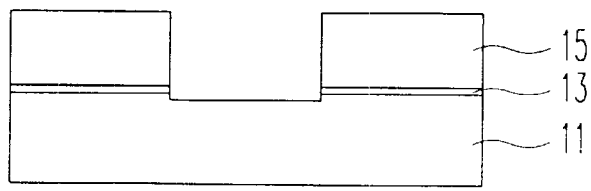
FIGS. 6a through 6f are simplified schematic cross sectional views showing a method for forming an element isolation film of a semiconductor device according to an embodiment of the present invention.
Figure 6B:
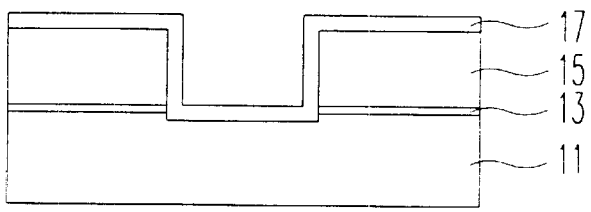
Figure 6C:
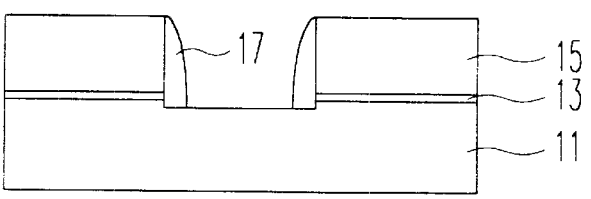
Figure 6D:
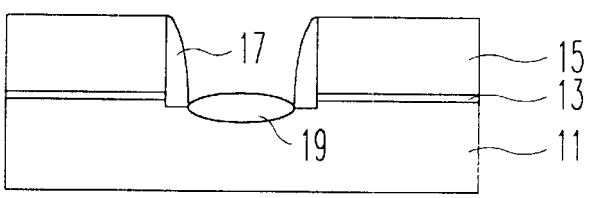

FIG. 6c is a cross section after the nitride 17 is anisotropically etched to form a nitride spacer at the side wall of the pattern. As shown, each sidewall spacer is defined on an edge of pad nitride 15. FIG. 6d is a cross section after the recessed semiconductor substrate 11 is oxidized to grow an oxide 19. In this regard, the oxidation is performed at a temperature of 800–900° C. by a thermal oxidation process and the oxide 19 is grown to a thickness of 100–500 Angstrom, for example.

Figure 6E:
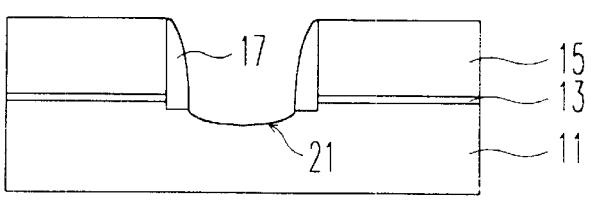

FIG. 6e is a cross section after the oxide 19 is selectively wet-etched by using a hydrofluoric acid, to form a recess 21.

Figure 6F:
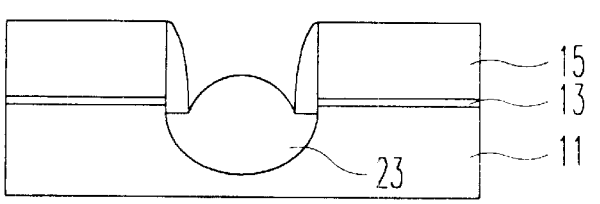

FIG. 6f is a cross section after a field oxide 23 is formed through field oxidation. The field oxidation is carried out with at least two processes: a BTFOX process; and an HTFOX process.

The BTFOX process and the HTFOX process, as used herein, are the field oxidation processes which are carried out below and over the transition temperature, respectively, at which an oxidation barrier is produced. That is, the BTFOX and HTFOX processes are discriminated by temperature.

Below a theoretical background and condition for the processes illustrated in FIG. 6 will be given with reference to some additional figures.

Figure 7:
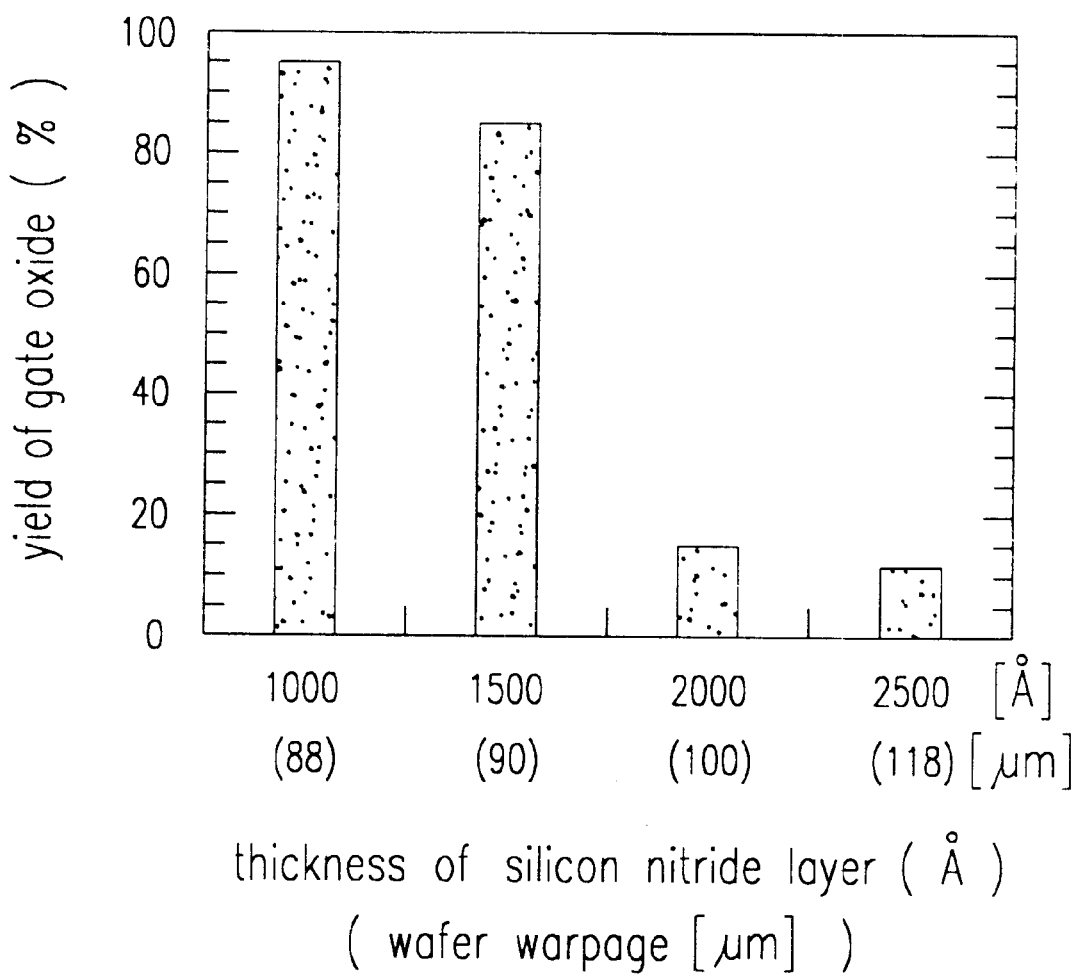
FIGS. 7 through 17 show methods for forming an isolation film of a semiconductor device according to an embodiment of the present invention and their properties, in cross sections and graphs.

To begin with, the thickness of the pad nitride 15 of FIG. 6a directly affects the reliability of the gate oxide, which is implicated in wafer warpage, as shown in the experiment data of FIG. 7. That is, even after the pad nitride 15 is formed by a low pressure chemical vapor deposition (hereinafter referred to as "LPCVD") process and removed from a field region on the front side of the wafer by an anisotropical etching process, the pad nitride 15 on the back side of the wafer remains intact. Thus, the unbalance in the tensile stress of the nitride occurs between the front side and the back side of the wafer, causing a serious warpage. The extent of such a wafer warpage is proportional to the thickness of the pad nitride 15 deposited.

FIG. 7 shows the relation of the yield of gate oxide with the thickness of the pad nitride. As shown in the graph, the properties of the gate oxide are well maintained when the pad nitride 15 is deposited to a thickness lower than 1,500 Angstrom while the properties are abruptly deteriorated when the pad nitride 15 is thicker than 1,500 Angstrom. Therefore, in accordance with the present invention, the pad nitride 15 is deposited to a thickness lower than 1,500 Angstrom, to give the gate oxide beneficial properties.

The thickness of the pad nitride 15 affects the improvement in the bird's beak as well as in the properties of the gate oxide. However, in contrast to the properties of the gate oxide, the bird's beak is shortened by a thick pad nitride. That is, as the pad nitride 15 is thicker, it is of greater resistance to the bird's beak and thus, shortens the bird's beak.

Hence, when only the pad nitride 15 is etched without recessing the semiconductor substrate 11 as in the FIG. 1a of the conventional technique, the pad nitride 15 and the nitride spacer should be at least 1,500 Angstrom and 500 Angstrom thick, respectively, in order to prevent the formation of the bird's beak. In this case, first of all, the deterioration of the gate oxide, attributable to the thick pad nitride, arises. In addition, a very thick nitride spacer compels the width of field oxide to be narrow under a design rule of 0.20 µm or less, aggravating the field oxide thinning effect shown in FIG. 4.

When the semiconductor substrate 11 is recessed to a depth of 50–100 Angstrom by over-etching the pad nitride 15, as illustrated in FIG. 6, not only can the pad nitride 15 be formed at a thickness lower than 1,500 Angstrom but also the nitride spacer 17 is allowed to have a thickness of 50–300 Angstrom while preventing the bird's beak because the structure of FIG. 6c extends the diffusion length to the pad oxide 13.

Thus, in accordance with the present invention, the pad nitride 15 is over-etched to recess the semiconductor substrate 11 to a depth of 50–100 Angstrom, with the aim of maintaining beneficial properties of the gate oxide, reducing the field oxide thinning effect as well as shortening the bird's beak under a design rule of 0.20 µm or less (see FIGS. 6a to 6c and FIG. 7).

As to the formation of the oxide 19 in FIG. 6d, it is in direct relation with the volume ratio of the field oxide, the length of the bird's beak and the oxidation-induced stress.

For the volume ratio of the field oxide, half of the field oxide grown upon silicon oxidation enters inside the substrate 11. Hence, as the oxide is thicker, the volume ratio of the field oxide can be increased because the recess 21 of FIG. 6e becomes deeper.

However, in the aspect of the length of the bird's beak, the thicker the oxide 19 is, the more disadvantageous it is. The reason of this disadvantage is that, since a kind of bird's beak is formed upon the formation of the oxide 19, the diffusion length to the pad oxide 13 is further shortened upon the field oxidation of FIG. 6f after the removal of the oxide 19, 50 that a relatively long bird's beak is formed. Further, the oxidation-induced stress increases with the thickness of the oxide 19, deleteriously affecting the gate oxide. On the other hand, if the oxide 19 is formed at too low of temperatures, it is disadvantageous in relieving the oxidation-induced stress and thus, a bad effect may be exerted on the properties of the gate oxide.

Therefore, when considering the volume ratio of the field oxide, the length of the bird's beak and the properties of the gate oxide, it is preferable that the oxide 19 is grown to a thickness of 100–500 Angstrom at a temperature of 800–900° C. (see, FIG. 6d).

A detailed description will be given of the removal of the oxide 19 shown in FIG. 6e, with the aid of FIG. 8.

Figure 8A:
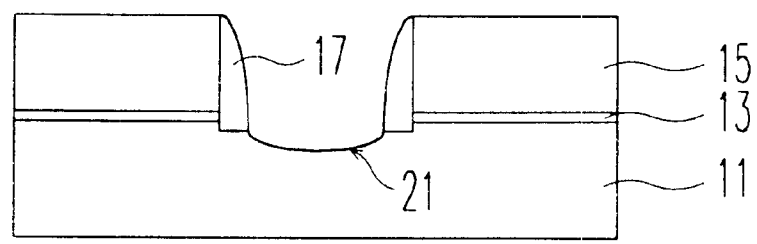
Figure 8B:
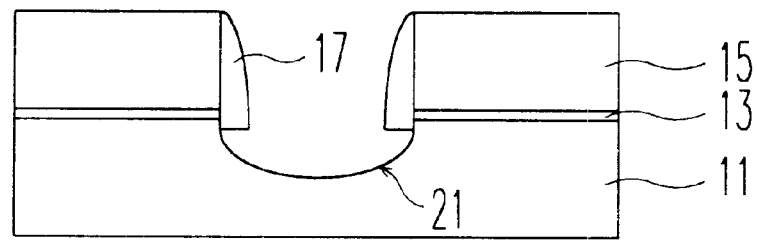

FIG. 8a is a dross section showing that, when the oxide 19 is removed with a diluted hydrofluoric acid (HF) solution to a factor of 20- to 100-fold, only the oxide 19 is etched so that the bottom of the oxide 19 is precisely identical in shape to that of the recess 21. On the other hand, when the oxide 19 is removed with a Buffered Oxide Etchant (BOE) to a factor of 100- to 300-fold, a part of the semiconductor substrate 11 as well as the oxide 19 is etched by the action of the BOE, so that the resulting recess 21 is widened, as shown in FIG. 8b. When the field oxide 23 is formed in the process of FIG. 6f after the removal of the oxide 19 with the BOE, the diffusion length to the pad oxide 13 is shortened while the bird's beak is lengthened. Thus, in accordance with the present invention, the oxide 19 is removed with a free hydrofluoric solution.

Optionally, the step of removing the oxide 19 of FIG. 6e which may be included in a precleaning step, is commonly carried out prior to the field oxidation of FIG. 6f. For instance, suppose that a precleaning step is carried out with a sulfuric acid and then, with a nitric acid, the oxide 19 can be removed by using the HF solution prior to sulfuric acid, between the sulfuric acid and the nitric acid or subsequent to the nitric acid (see, FIGS. 3e and 8).

Figure 9:
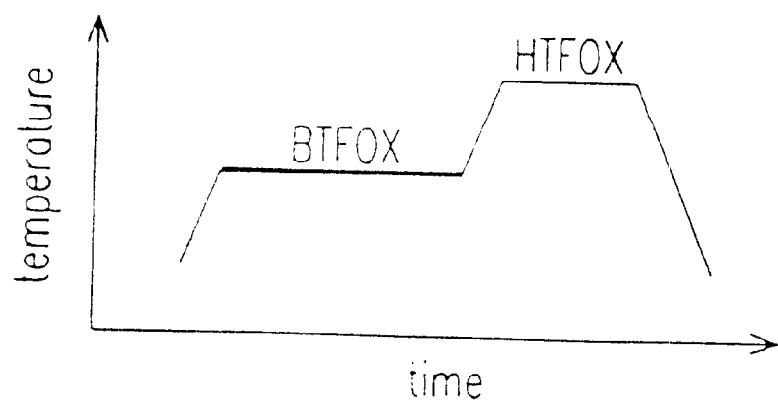

Now, turning to FIG. 9, the field oxidation of FIG. 6f, is formed in a combination of one or at least two processes: BTFOX; and HTFOX processes.

The BTFOX process aims to solve the FOU phenomenon. As above described in FIG. 2, the initial temperature of the field oxidation should be below 1,040° C. in order to prevent the FOU phenomenon. Once a field oxide is grown to a certain thickness at a temperature lower than 1,040° C. by the BTFOX, substantially no FOU phenomenon occurs in the HTFOX process which follows the BTFOX process because the field oxide comes to sufficiently secure the diffusion path of oxidant.

The HTFOX process has at least two goals. First, the high temperature of the process mitigates the field oxide thinning effect. The second goal is to improve the properties of the gate oxide. Because a field oxide is of high viscosity when it is formed at a low temperature, the stress caused owing to the volume expansion of the field oxide during field oxidation is not relieved, but is transferred into the semiconductor substrate. Therefore, the reliability of the gate oxide is improved as the field oxidation is carried out at higher temperatures.

The HTFOX of FIG. 9 can be divided into wet HTFOX (hereinafter referred to as "W-HTFOX") and dry HTFOX (hereinafter referred to as "D-HTFOX") which are executed in a wet oxidation atmosphere and a dry oxidation atmosphere, respectively.

In FIG. 9, the total field oxide thickness is contributed by the combination of BTFOX and the HTFOX processes. The thickness ratio of the BTFOX oxide to the HTFOX oxide may be optionally controlled. However, in order to cause only a small amount of stress, the BTFOX oxide is preferably formed as thinly as possible and at as high temperatures as possible unless an FOU phenomenon occurs. In one embodiment, an optimal thickness of the BTFOX is about 500 to about 1,000 Angstroms, regardless of the total field oxide thickness.

A field oxide whose entire thickness is contributed to partially by a BTFOX process, partially by a field oxidation process to the same extent with the BTFOX process, and partially by a HTFOX process which is carried out in a tube or furnace after the wafer is exposed to the air, is also within the scope and the spirit of the present invention.

Figure 10:
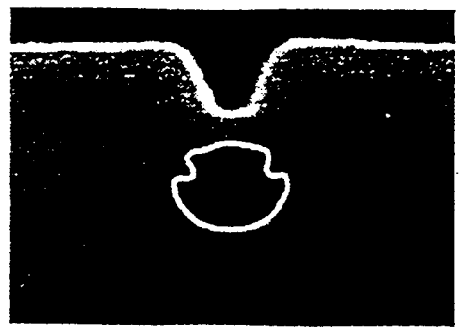

FIG. 10 shows a cross section of a field oxide which is formed to a thickness of approximately 3,000 Angstrom on a wafer by a combination of BTFOX and HTFOX processes illustrated in FIG. 9. This field oxide was grown to a thickness of approximately 500 Angstrom at 1,000° C. by a wet BTFOX process and the remaining thickness, approximately 2,500 Angstrom, was contributed by a W-HTFOX process which is carried out at a temperature of approximately 1,100° C. In result, as in FIGS. 3a and 3b, the field oxide showed no FOU in spite of the high temperature, 1,100° C. Consequently, the field method oxidation suggested in FIG. 9 can basically solve the FOU phenomenon while taking advantage of high temperatures, such as 1,100° C.

A better understanding of the present invention may be obtained in light of following embodiments which are set forth to illustrate, but are not to be construed to limit the present invention.

Figure 11:
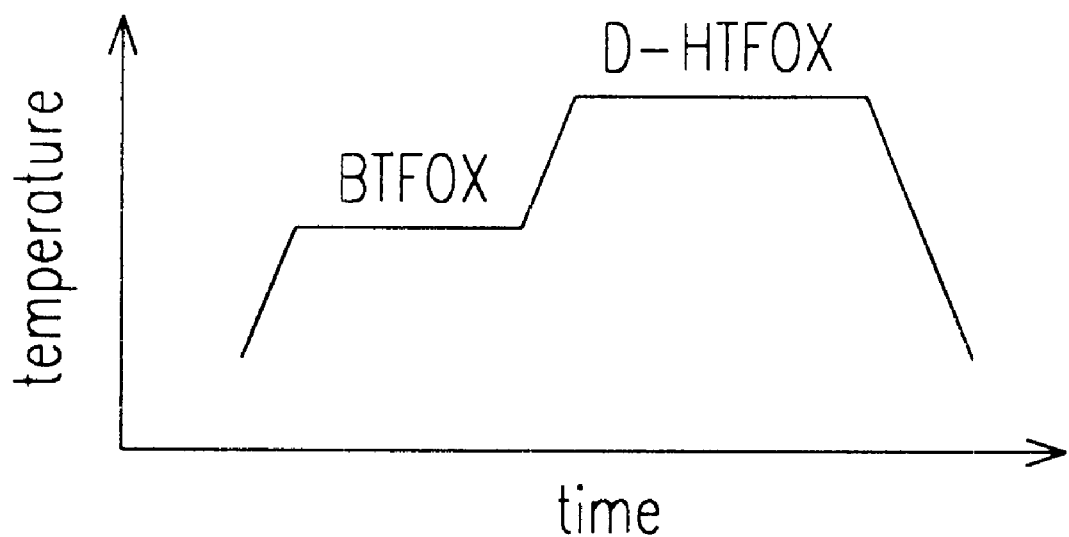

In a specific embodiment, FIG. 11 shows a combination of a BTFOX process and a dry-HTFOX (hereinafter D-HTFOX) referred to as process or Embodiment 1.

Herein, the BTFOX process which is, as aforementioned, to solve the FOU phenomenon, may be executed in a wet or a dry oxidation manner: the former is advantageous in an aspect of oxidation time. On the other hand, the HTFOX is to improve the field oxide thinning phenomenon as well as the reliability of the gate oxide.

Figure 12A:
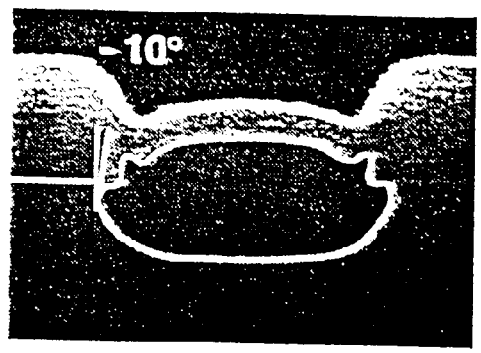
Figure 12B:
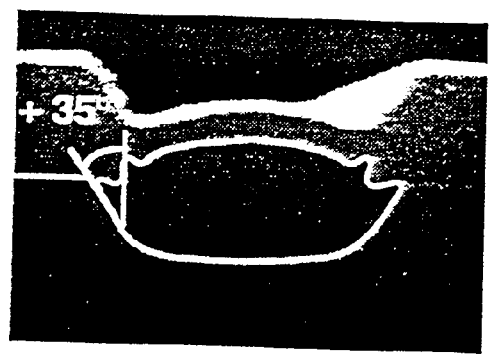

FIG. 12 illustrates the reason the D-HTFOX is chosen: FIG. 12a is a cross section of a field oxide which is formed by a combination of a BTFOX process and a W-HTFOX process; FIG. 12b is a cross section of a field oxide which is formed by a combination of a BTFOX process and a D-HTFOX process. As seen, the D-HTFOX increases the slope of the field oxide, so that the electric field concentrated to the edge of the gate oxide can be reduced, thereby improving the properties of the gate oxide.

Referring to FIG. 13, there are shown the yields of the gate 35 oxide, which are dependent on the combination of BTFOX and HTFOX.

Figure 13A:
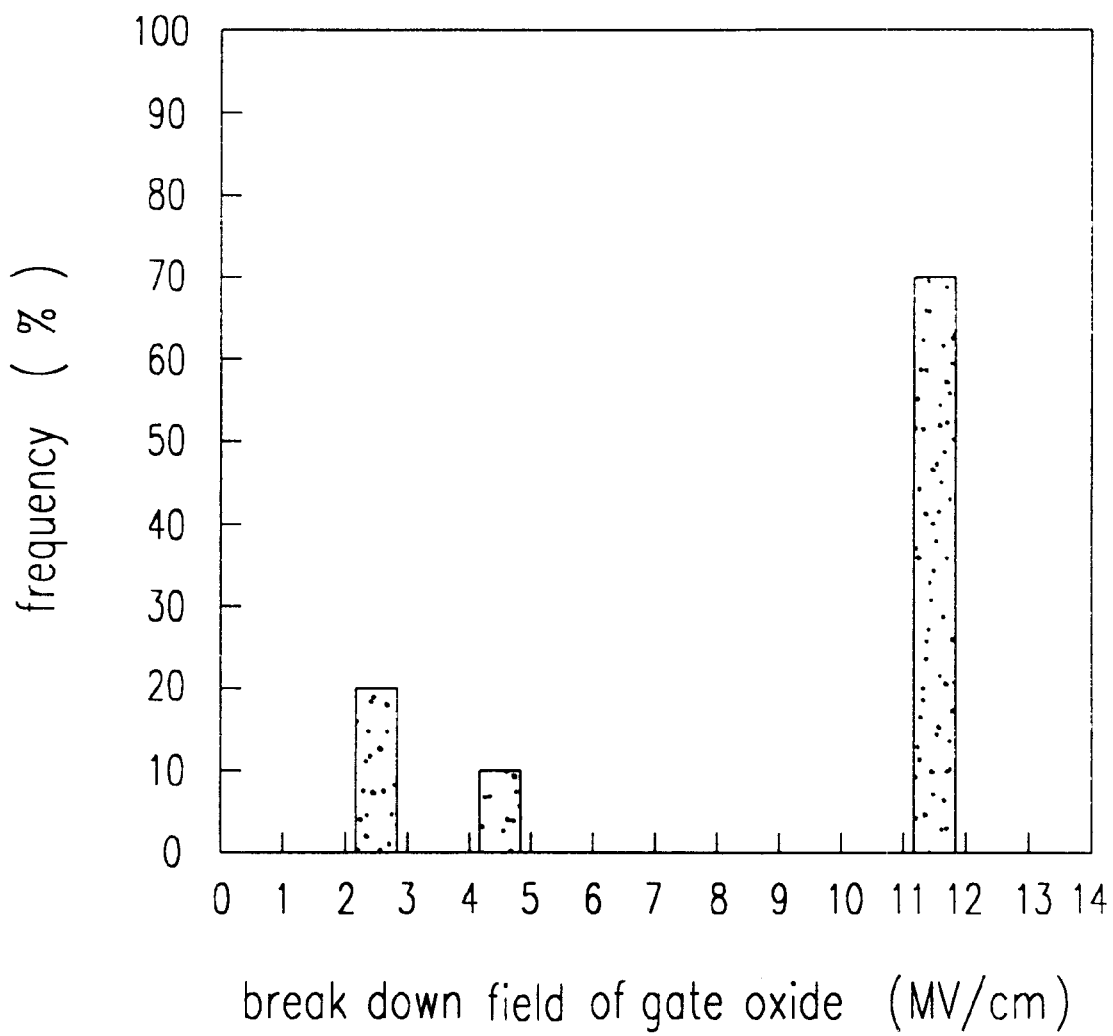
Figure 13B:
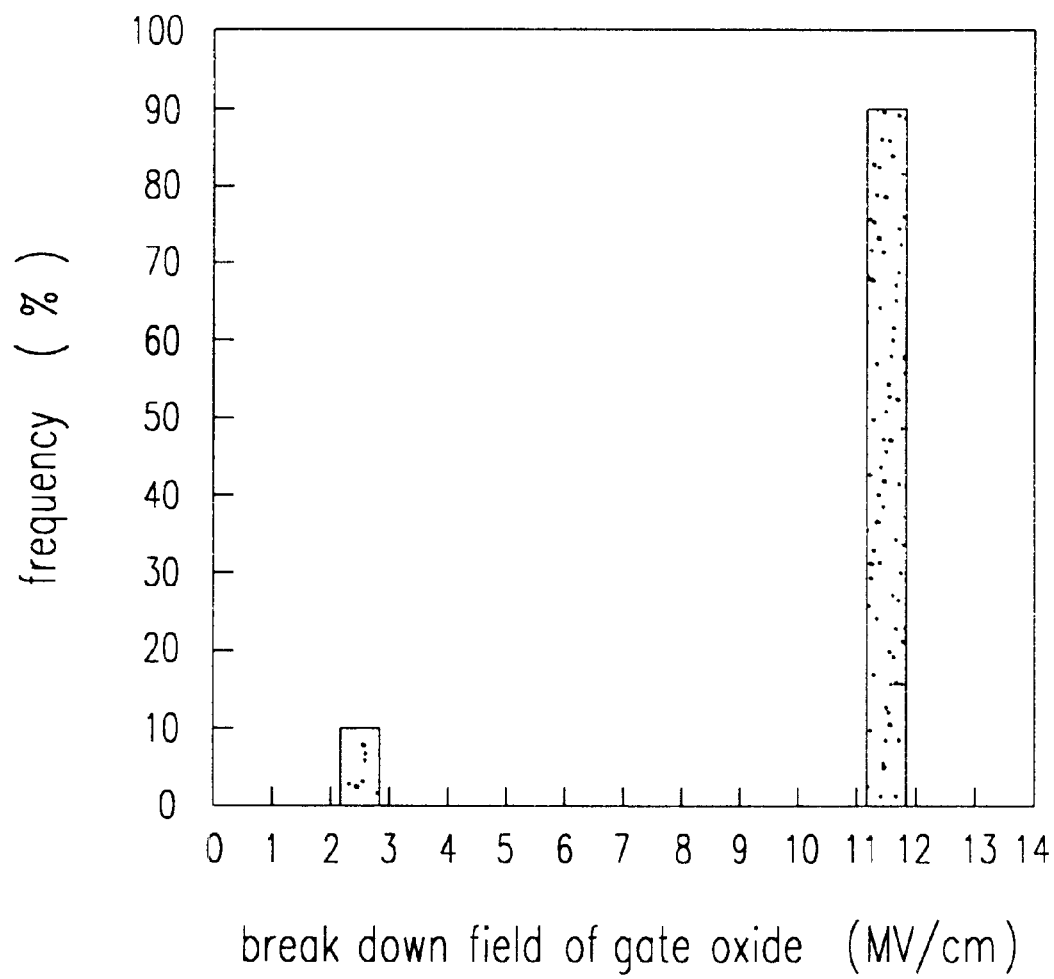

FIG. 13a is obtained from a combination of a BTFOX process and a W-HTFOX process and FIG. 13b from a combination of a BTFOX process and a D-HTFOX process.

As shown in these graphs, the D-HTFOX improves the reliability of the gate oxide. In addition, the D-HTFOX is more effective for the stress relief than is the W-HTFOX because the oxidation time of the D-HTFOX is long enough to relieve the stress accumulated during the BTFOX which is executed at a lower temperature.

In this Embodiment 1, the thickness ratio of the BTFOX oxide to the D-HTFOX oxide may be optionally modulated. Some of the techniques are described throughout this specification but are not limited to these.

Figure 14:
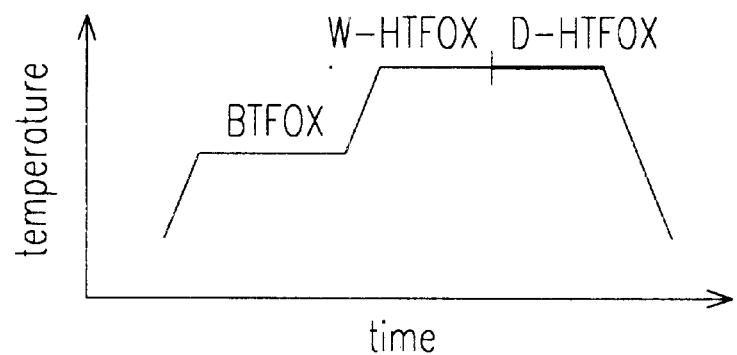

Referring to FIG. 14 in an alternative embodiment (Embodiment 2), there is a field oxidation process in which a BTFOX process is first performed, followed by a W-HTFOX process and then, by D-HTFOX process.

As in the previous embodiment, the BTFOX is introduced to solve the FOU phenomenon and the HTFOX is to improve the field oxide thinning effect and the reliability of the gate oxide at once.

In contrast to that of the previous embodiment, the HTFOX of Embodiment 2 is divided into two processes, including W-HTFOX and D-HTFOX. The former has an effect of reducing the oxidation time while the latter increases the slope of the field oxide so as to alleviate the electric field concentrated on the edge of the gate oxide, thereby improving the reliability of the gate oxide.

In this Embodiment 2, the thickness ratio of the BTFOX oxide to the W-HTFOX oxide to D-HTFOX oxide may be optionally modulated.

Figure 15:
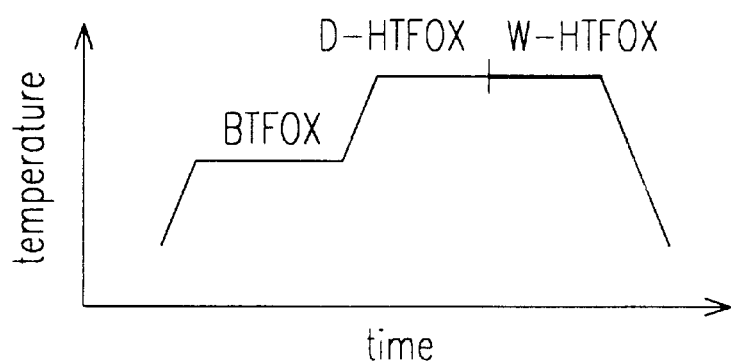

Referring to FIG. 15 (Embodiment 3), there is a field oxidation process in which a BTFOX process is first performed, followed by a D-HTFOX process and then, by W-HTFOX process.

As in Embodiment 1, the BTFOX aims to solve the FOU phenomenon and the HTFOX is introduced to improve the field oxide thinning effect and the reliability of the gate oxide, at once.

Like that of Embodiment 2, the HTFOX of Embodiment 3 is divided into two processes, W-HTFOX and D-HTFOX, but they are performed in the reverse order. The reason why the D-HTFOX is taken prior to the W-HTFOX is that the much of the total process time is saved by reducing the oxidation time necessary to grow the field oxide to a desired thickness.

In this Embodiment 3, the thickness ratio of the BTFOX oxide to the D-HTFOX oxide to W-HTFOX oxide may be optionally modulation. When the D-HTFOX is performed prior to the W-HTFOX, the oxidation time often necessary to grow a desired thickness is greatly reduced because the oxide thickness has a parabolic relation with respect to oxidation time.

Figure 16:
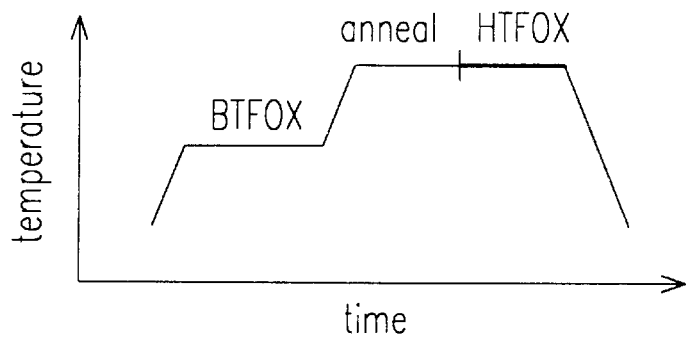

FIG. 16 shows a field oxidation process comprising a BTFOX step, an annealing step and an HTFOX step (Embodiment 4). The BTFOX step which is to solve the FOU phenomenon may be executed in a wet or a dry oxidation manner: the former is advantageous in an aspect of time. On the other hand, the HTFOX is to improve the field oxide thinning phenomenon as well as the reliability of the gate oxide and may take advantage of wet or dry oxidation.

The annealing step is introduced prior to a HTFOX step, to relieve the stress caused owing to the BTFOX step of low temperatures. Thus, the field oxide thinning effect is improved during the HTFOX step and finally, the reliability of the gate oxide is improved. The annealing step may be carried out at a temperature of 900–1,200° C. for 10 minutes to 2 hours under an inert atmosphere, such as nitrogen and argon.

Optionally, the HTFOX may be carried out in discrete W-HTFOX and D-HTFOX steps.

The thickness ratio of the BTFOX oxide to the HTFOX oxide may be optionally controlled. Some techniques for controlling this ratio have been described in this specification but are not limited to these techniques.

Figure 17:
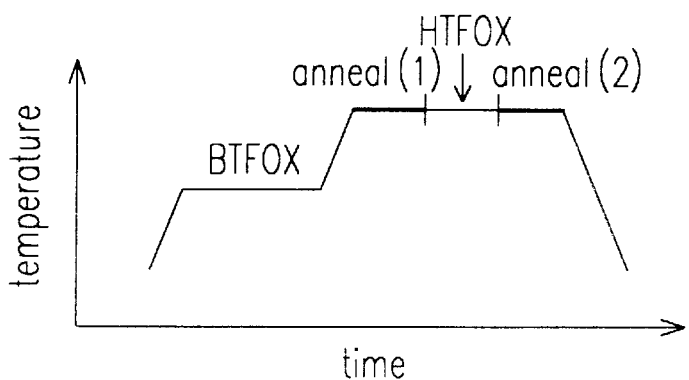

Referring to FIG. 17 (Embodiment 5), there is a field oxidation process which comprises a BTFOX step, a first annealing step, an HTFOX step and a second annealing step. The objects and conditions of the BTFOX, the first annealing step and the HTFOX in Embodiment 5 is identical to those in Embodiment 4. The second annealing aims to finally relieve the stress accumulated during the formation of the field oxide so as to improve the properties of the gate oxide. The second annealing step may be carried out at a temperature of 900–1,200° C. for 10 minutes to 2 hours under an inert atmosphere, such as nitrogen and argon.

Optionally, the HTFOX may be carried out in discrete W-HTFOX and D-HTFOX steps. Some techniques for controlling this ratio have been described in this specification, but are not limited to these techniques.

According to the present invention, the annealing step can be repeated many times, for example, a first annealing step, a second annealing step, . . . , to an nth annealing step, may be carried out in one recipe or discrete recipes and this is regarded as to be within the spirit of the present invention.

The thickness ratio of the BTFOX oxide to the HTFOX oxide may be optionally controlled. Some techniques for controlling this ratio have been described in this specification but are not limited to these techniques.

As described hereinbefore, the method for forming an element isolation film of a semiconductor device, according to the present invention, substantially prevents the FOU phenomenon, so that a complete shape of the element isolation film can be obtained. The HTFOX process in the method, which may be further divided into two discrete steps, a wet and a dry HTFOX step, has advantages of mitigating the field oxide thinning effect and improving the reliability of the gate insulator, thereby making it possible to highly integrate semiconductor devices.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for forming an isolation region in a semiconductor substrate, said method comprising:

providing a semiconductor substrate including an upper surface;

forming an element isolation mask on the upper surface of the semiconductor substrate, said element isolation mask including an exposed region of the upper surface;

forming a spacer at a side wall of said element isolation mask;

oxidizing an exposed region of the upper surface of the semiconductor substrate to grow an oxide in the exposed region of the upper surface of the semiconductor substrate;

removing the oxide formed in the exposed region of the upper surface of the semiconductor substrate to a certain depth to form a recess, said exposed region corresponding to a field isolation region; and carrying out sequentially a break-through field oxidation, an annealing treatment and a high temperature field oxidation to form a field oxide in the recess while limiting a field oxide undergrowth.

2. A method in accordance with claim 1, wherein said breakthrough field oxidation is carried out at a temperature of approximately 900–1,040° C.

3. A method in accordance with claim 1, wherein said breakthrough field oxidation and said high temperature field oxidation each are carried out in a dry or a wet atmosphere.

4. A method in accordance with claim 1, wherein said high temperature field oxidation is carried out at a temperature of approximately 1,050–1,300° C.

5. A method in accordance with claim 1, wherein said annealing step is carried out at a temperature of approximately 900–1,200° C. in an inert atmosphere.

6. A method in accordance with claim 1, wherein said breakthrough field oxidation, said annealing step and said high temperature field oxidation all are carried out in one recipe.

7. A method in accordance with claim 1, wherein said breakthrough field oxidation, said annealing step and said high temperature field oxidation are carried out in discrete recipes.

8. A method in accordance with claim 1, wherein said field oxide is formed by a sequence of said break-through field oxidation, a first annealing step, said high temperature field oxidation and a second annealing step.

9. A method in accordance with claim 8, wherein said breakthrough field oxidation, said first annealing step, said high temperature field oxidation and said second annealing step are carried out in one recipe.

10. A method in accordance with claim 8, wherein said breakthrough field oxidation, said first annealing step, said high temperature field oxidation and said second annealing step each are carried out in discrete recipes.

11. A method in accordance with claim 1, wherein said high temperature field oxidation is carried out in a dry atmosphere and then, in a wet atmosphere, or in the reverse order.

12. A method for forming an isolation region in a semiconductor substrate, said method comprising:

providing a semiconductor substrate including an upper surface;

forming an element isolation mask on the upper surface of the semiconductor substrate, said element isolation mask including an exposed region of the upper surface;

oxidizing an exposed region of the upper surface of the semiconductor substrate to grow an oxide in said exposed region;

removing the oxide formed in the exposed region of the upper surface of the semiconductor substrate to a certain depth to form a recess, said exposed region corresponding to a field isolation region; and carrying out sequentially a break-through field oxidation, a non-oxidizing annealing treatment and a high temperature field oxidation to form a field oxide in the recess.

13. A method for forming an isolation region in a semiconductor substrate, said method comprising:

providing a semiconductor substrate including an upper surface;

forming an element isolation mask on the upper surface of the semiconductor substrate, said element isolation mask including an exposed region of the upper surface;

forming a spacer at a side wall of said element isolation mask;

oxidizing an exposed region of the upper surface of the semiconductor substrate to grow an oxide in the exposed region of the upper surface of the semiconductor substrate;

removing the oxide formed in the exposed region of the upper surface of the semiconductor substrate to a certain depth to form a recess, said exposed region corresponding to a field isolation region; and carrying out sequentially a break-through field oxidation at a first temperature of less than approximately 1040° C., and a high temperature field oxidation at a second temperature of greater than approximately 1050° C., a non-oxidizing anneal wherein a field oxide undergrowth is limited.

14. The method according to claim 13, wherein the break through field oxidation is performed prior to the high temperature field oxidation.

15. The method according to claim 13, wherein the first temperature is approximately 900–1,040° C.

16. The method according to claim 13, wherein the breakthrough field oxidation and the high temperature field oxidation each are carried out in a dry or a wet atmosphere.

17. The method according to claim 13, wherein the second temperature is approximately 1,050–1,300° C.

18. The method according to claim 13, wherein the second temperature is greater than 1150° C.

19. The method according to claim 13, wherein the anneal carried out at a temperature between approximately 900° C. and 1200° C. in an inert atmosphere.

* * * * *